United States Patent
Lu et al.

(10) Patent No.: US 7,561,996 B2
(45) Date of Patent: Jul. 14, 2009

(54) AUTOMATED DIMENSIONAL DRAWING GENERATING APPARATUS

(75) Inventors: Yun Lu, Troy, MI (US); David M Goecke, Royal Oak, MI (US); Stephen E Landrum, Warren, MI (US); Hugh W Cumming, Lake Orion, MI (US); Bruce P Mattarella, Canton, MI (US)

(73) Assignee: Chrysler LLC, Auburn Hills, MI (US)

( * ) Notice: Subject to any disclaimer, the term of this patent is extended or adjusted under 35 U.S.C. 154(b) by 352 days.

(21) Appl. No.: 11/331,910

(22) Filed: Jan. 13, 2006

(65) Prior Publication Data

US 2007/0168165 A1    Jul. 19, 2007

(51) Int. Cl.
*G06F 9/455* (2006.01)

(52) U.S. Cl. .................. 703/7; 703/8; 703/1; 345/419; 345/420

(58) Field of Classification Search ............... 703/1, 703/11, 8, 7, 6; 707/2, 103 R; 345/420, 345/156, 419; 700/182; 715/234, 849, 700; 716/11
See application file for complete search history.

(56) References Cited

U.S. PATENT DOCUMENTS

| | | | |
|---|---|---|---|
| 4,964,060 A | 10/1990 | Hartsog | |
| 5,980,096 A | 11/1999 | Thalhammer-Reyero | |
| 6,341,261 B1 | 1/2002 | Vasey-Glandon et al. | |
| 6,690,385 B1 | 2/2004 | Mukherjee | |
| 6,766,282 B1 | 7/2004 | Schettine | |
| 6,871,108 B2 | 3/2005 | Carlucci et al. | |
| 6,918,095 B1 * | 7/2005 | Agnes et al. | 715/849 |
| 2001/0018644 A1 * | 8/2001 | Schwalb et al. | 703/7 |
| 2002/0133319 A1 * | 9/2002 | Tang | 703/1 |
| 2003/0071810 A1 * | 4/2003 | Shoov et al. | 345/420 |
| 2003/0204524 A1 * | 10/2003 | Wu et al. | 707/103 R |
| 2005/0188309 A1 * | 8/2005 | Tasker et al. | 715/700 |
| 2005/0212797 A1 * | 9/2005 | Lee et al. | 345/419 |
| 2005/0225551 A1 * | 10/2005 | Shimizu et al. | 345/419 |
| 2006/0066609 A1 * | 3/2006 | Iodice et al. | 345/419 |
| 2006/0106757 A1 * | 5/2006 | Sakai et al. | 707/2 |
| 2007/0027571 A1 * | 2/2007 | Kamiya et al. | 700/182 |
| 2007/0027667 A1 * | 2/2007 | Osborn et al. | 703/11 |
| 2007/0038422 A1 * | 2/2007 | Wang et al. | 703/8 |
| 2007/0078634 A1 * | 4/2007 | Krishnapillai | 703/1 |

* cited by examiner

*Primary Examiner*—Paul L Rodriguez
*Assistant Examiner*—Kandasamy Thangavelu
(74) *Attorney, Agent, or Firm*—Ralph E. Smith

(57) ABSTRACT

A dimensioning apparatus for generating a dimensional drawing from a model includes an element database with predetermined element names. A plurality of model elements can be associated with corresponding element names. The apparatus also includes a model sectioning tool operable to section the model to thereby generate at least a portion of the model elements. The apparatus further includes a dimensioning tool with a plurality of predetermined dimension names and a plurality of dimensioning algorithms associated with corresponding dimension names. At least two of the model elements are utilized by each of the dimensioning algorithms to thereby automatically detect dimension values of the model. The dimensioning tool is further operable to associate the detected dimension values with corresponding ones of the dimension names. In addition, the dimensioning apparatus includes a plotting tool operable to output the dimensional drawing showing the dimension values of the model detected by the dimensioning tool.

16 Claims, 15 Drawing Sheets

| Section Plane No. | Section Names |
|---|---|
| 24a | Y PLANE AT VEHICLE CENTERLINE — 29a |
| 24b | X PLANE AT VEHICLE FRONT SPINDLE — 29b |
| 24c | X PLANE AT VEHICLE REAR SPINDLE — 29c |
| 24d | X PLANE AT DRIVER SEATING REFERENCE POINT — 29d |
| 24e | Y PLANE AT DRIVER SEATING REFERENCE POINT — 29e |
| 24f | X PLANE AT CENTER OF DRIVER HEADFORM — 29f |
| 24g | X PLANE AT 2ND ROW PASSENGER SEATING REFERENCE POINT — 29g |
| 24h | X PLANE AT 2ND ROW PASSENGER SEATING REFERENCE POINT -330MM — 29h |
| 24i | Y PLANE AT 2ND ROW PASSENGER SEATING REFERENCE POINT — 29i |
| 24j | X PLANE AT CENTER OF 2ND ROW PASSENGER HEADFORM — 29j |
| 24k | X PLANE AT 3RD ROW PASSENGER SEATING REFERENCE POINT — 29k |
| 24l | Y PLANE AT 3RD ROW PASSENGER SEATING REFERENCE POINT — 29l |
| 24m | X PLANE AT CENTER OF 3RD ROW PASSENGER HEADFORM — 29m |

*FIG-3*

Ergonomic → Vehicle Wheel 1 → Rear Spindle → A point

ERGO_VehWheel Rear SpindlePt
25

| Field 1 - Domain | Field 2 - Object | Field 3 - Object Detail | Field 4 - Object Type |

| # | Status | Element | Name | Type | Geometry |
|---|---|---|---|---|---|
| 1 | | Side View Body | IDEN_SvBody | Curves | |
| 2 | x | Side View Front Wheel | ERGO_VehTireFrontCLPt | Point | FRNT TIRE TRUE RADIU... |
| 3 | x | Side View Rear Wheel | ERGO_VehTireRearCLPt | Point | RR TIRE TRU RADIUS PT |
| 4 | x | Front Spindle | ERGO_VehWheelFrontSpindl... | Point | DRIVER FRT |
| 5 | x | Rear Spindle | ERGO_VehWheelRearSpindl... | Point | DRIVER RR |
| 6 | x | Ground Line (Y) | ERGO_VehGroundCurbLn | Line | sPLIT.2 |
| 7 | x | Front Bumper Lmt (Y) | ERGO_VehFrontBumperLmtCrv | Curves | W/S @ C/L Drvr |
| 8 | x | Rear Bumper Lmt (Y) | ERGO_VehRearBumperLmtCrv | Curves | RR BUMPER @ Y=0 |
| 9 | | Roof (Y) | ERGO_VehExtRoofYSectCrv | Curves | |
| 10 | | Rear View Front H-Point Bod... | ERGO_RvLeftBody | Curves | |

*FIG-4*

| Code | Description |
|---|---|
| H5 | SgRP - Front to Ground |
| H10 | SgRP - Second to Ground |
| H18 | steering Wheel Angle |
| H70 | SgRP - front - Z coordinate |
| H71 | SgRP - second - Z coordinate |
| H74 | steering Wheel to Cushion |
| H101 | Vehicle Height (curb Load) |
| H103 | Front Bumper to Ground (curb wt.) |
| H105 | Rear Bumper to Ground (curb wt.) |
| H106 | Angle of Approach |
| H107 | Angle of Departure |
| H121 | Window Slope Angle - Backlight |
| H122 | Window Slope Angle - Windshield |
| H124 | Vision Angle to Windshield upper |
| H124B | Vision Angle to Windshield lower |
| H130 | Step Height - Front(curb weight) |
| H131 | step Height - Second(curb weight) |
| H147 | Ramp Breakover Angle |
| H148 | Suspension or Axle to Ground - Front |
| H153 | Suspension or Axle to Ground - Rear |
| H156 | Minimum Running Ground Clearance |
| H195 | Liftover Height |
| H250 | Open Tailgate to Ground |
| L7 | Steering Wheel Torso Clearance |
| L31 | SgRP - front - X coordinate |
| L32 | SgRP - Second to Rear Wheel C/l |
| L35 | SgRP - second - X coordinate |
| L101 | Wheelbase |
| L103 | vehicle Length |
| L104 | Overhang - Front |
| L105 | Overhang - Rear |
| L114 | Front Wheel to Front SgRP c/l |
| L125 | Cowl Point - X coordinate |
| L127 | Rear Wheel Centerline X coordinate |
| L128 | Front Wheel Centerline X coordinate |
| L403 | Front of Bumper to Back of Cab |
| L404 | Cab to Rear Axle |
| L410 | Cab Length |
| L504 | Cab to Pickup Body |
| L505 | Pickup Body Length at Floor |
| L506 | Pickup Body Length at Top of Body |
| L507 | Pickup Body Overall Length |
| W7X | Steering Wheel Center X coordinate |

| Name | Input | Description | Illustration |
|---|---|---|---|
| CalXYZDim | Point | A COORDINATE IS DUMPED | |
| SqueezeBetweenPlanes | Two Curves | PARALLEL PLANES FORCED TO BE TANGENT TO BOTH CURVES, ARE SET FOR WIDEST SEPARATION. DISTANCE IS THIS SEPARATION. | |
| PopAParallelLine | Point and Curve | A PLANE (NORMAL TO A PRIMARY DIRECTION) IS TANGENT TO CURVE AND DIRECTIONAL DISTANCE IS MEASURED FROM THE POINT TO THE PLANE. | |
| CurveSeparationInView | Two Curves | CURVES ARE PROJECTED TO A PRINCIPLE PLANE. SHORTEST DISTANCE IS CALCULATED | |
| DimAgainstSameSide | Two Curves | EACH CURVE HAS ITS SEPARATE TANGENT PLANE. THESE PLANES BEING PARALLEL, DISTANCE IS MEASURED BETWEEN. | |
| CalPtToLnDistDim | Point and Line | DIRECTED DISTANCE FROM THIS POINT TO THE LINE. | |
| CalPtToPtXYZDistDim | Two Points | DISTANCE IS DIRECTION DIFFERENCE, IF 2D DISTANCE IN VIEW. | |

FIG - 8A

| Name | Input | Description | Illustration |
|---|---|---|---|
| DoubleOneSided | Two Curves | EACH CURVE HAS ITS SEPARATE TANGENT PLANE. THESE PLANES BEING PARALLEL, DISTANCE IS MEASURED BETWEEN. |  |
| DoubleSqueezePlanes | Curve | A PLANE, PARALLEL TO A PRINCIPLE IS TANGENT TO THE CURVE AGAINST A DIRECTION. DISTANCE IS DOUBLED. | 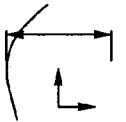 |
| CalcAngleVsLine | Point and Line | THE ANGLE, VS A GIVEN DIRECTION, FROM LINE IS FOUND |  |
| directedAngle | Point and Two Lines | THE ANGLE BETWEEN THE TWO LINES IS FOUND AGAINST AN AXIS THROUGH THE POINT. | 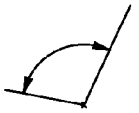 |
| CircleThroughCurve | Point and Curve | A CIRCLE OF DESIGNATED RADIUS CENTERED AT THE POINT IS INTERSECTED WITH THE CURVE. AN ANGLE MEASURED BETWEEN VERTICAL IS THROUGH THE POINT POINT TO THE INTERSECTION. |  |
| CalPtToCrvMmnistDim | Point and Curve | SEEK THE MINIMUM RADIUS SUCH THAT A CIRCLE CENTERED AT THE POINT TOUCHES THE CURVE. | 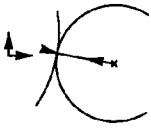 |
| CalPtToCrvChop | Point and Curve | A PLANE THROUGH THE POINT INTERSECTS THE CURVE, WHENCE THE DISTANCE (2ND IN THE VIEW) IS MEASURED. | 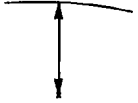 |

FIG - 8B

| Name | Input | Description | Illustration |
|---|---|---|---|
| CalPtAlongLine | Point and Curve | A PLANE WITH A DESIGNATED THROUGH THE POINT; INTERSECT THE CURVE. DISTANCE IS 2D BETWEEN POINT AND INTERSECTION. |  |
| Cal2PtAlongLine | Point and Two Curves | A PLANE; WITH A DESIGNATED NORMAL, THROUGH THE POINT; INTERSECTS EACH CURVE. DISTANCE IS 2D BETWEEN THE INTERSECTIONS. |  |
| CalDistAlongLineToExtreme | Point, Curve, Line | A PLANE IS NORMAL TO THE LINE AND TANGENT TO THE CURVE. DISTANCE IS MEASURED BETWEEN PLANE AND POINT. | 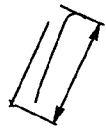 |
| PushItToExtreme | Point, Line | IN VIEW, PERPENDICULAR TO THE VIEW AND PARALLEL TO THE LINE IS TANGENT TO THE CURVE. DISTANCE IS BETWEEN THE LINE AND THE PLANE. |  |
| WideSideMirror | One or Two Curves | A PLANE, TANGENT TO EACH CURVE IS GENERATED. IF TWO, THE PARALLEL DISTANCE IS REPORTED. IF ONE, DOUBLE THE DISTANCE TO A DESIGNATED PRINCIPLE PLANE IS REPORTED. | 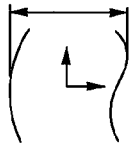 |
| DoubleCalXYZDim | Point | THE DISTANCE TO A PRINCIPLE PLANE IS DOUBLED. | 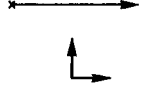 |
| LateralTube 1 Target<br>LateralTube 3 Target | Point, Curve<br>Point, Curves | A BOX OF SPECIFIED LATERAL DIMENSIONS, ABOUT THE POINT, IS EXTRUDED UNTIL IT TOUCHES THE/A CURVE | 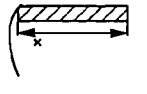 |

FIG - 8C

| Name | Input | Description | Illustration |
|---|---|---|---|
| DiagonalExtrusion | Point, Two Curves | THE CURVES ARE PROJECTED TO A PLANE. EACH PROJECTION IS EXTRUDED A SPECIAL DIRECTION. THE DISTANCE IS MEASURED BETWEEN THE INTERSECTION OF THE EXTRUSIONS AND THE PROJECTION PLANE. | 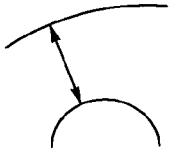 |
| PtClearanceInView | Curve and Curves | ALL CURVES ARE PROJECTED TO A PLANE. DISTANCE IS THE LEAST BETWEEN THE FIRST CURVE AND EACH OF THE GROUP OF CURVES |  |
| SightAngleUpwardFront | Curve and Curves, Line | MINIMAL ANGLE BETWEEN THE LINE AND A LINE TANGENT TO THE FIRST CURVE AND TANGENT TO ONE OF THE GROUP OF CUIVES | 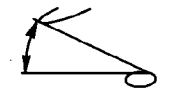 |
| SightAngleDownFront | Curve and Curves, Line | MINIMAL ANGLE BETWEEN THE LINE AND A LINE TANGENT TO THE FIRST CURVE AND TANGENT TO ONE OF THE GROUP OF CURVES | 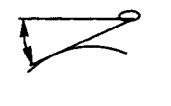 |
| SightAngleDownRear | Curve and Curves, Line | MINIMAL ANGLE BETWEEN THE LINE AND A LINE TANGENT TO THE FIRST CURVE AND TANGENT TO ONE. OF THE GROUP OF CURVES | 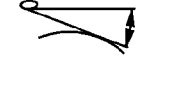 |
| GroundClearance | Line, curve, point and point | ANGLE BETWEEN THE LINE AND A LINE TANGENT TO THE CURVE AND THE A CIRCLE CENTERED AT THE FIRST POINT THROUGH THE SECOND POINT. |  |
| BreakoverAngle | Points and Curve | ANGLE BETWEEN LINES, EACH TANGENT TO CIRCLES GENERATED THE POINT FROM INFORMATION, AS THESE LINES MEET ON THE CURVE. MAXIMUM ANGLE IS FOUND. | 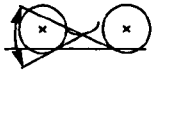 |

FIG - 8D

| Name | Input | Description | Illustration |
|---|---|---|---|
| towardAlongLine | Curve, Curve | A LINE IS TANGENT LATERALLY TO THE FIRST, A PLANE TANGENT TO THE END OF FIRST AND A PARALLEL PLANE IS TANGENT TO AN END OF THE SECOND. SEEK THE LENGTH OF THE SEGMENT OF THE LINE BETWEEN THE PLANES |  |
| AngleTakenFromLine | Line, Direction | ANGLE IS MEASURED PER VIEW | 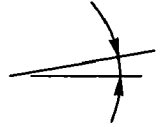 |
| FloatBetweenCurves | Curve, Curve | POINTS ARE GENERATED PLANAR BY INTERSECTION ON THE SECOND CURVE. DISTANCE IS FROM ONE OF THESE POINTS TO A PLANE TANGENT TO THE FIRST CURVE. |  |
| betweenAlongLine | Curve, Curves | A PLANE, TANGENT TO THE CURVE, INTERSECTS EACH OF GROUP OF CURVES. | 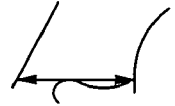 |
| CalLnToCrv Chop | Point, Line, Curve | A PLANE THROUGH THE POINT INTERSECTS BOTH THE LINE AND THE CURVE. DISTANCE IN VIEW IS MEASURED. | 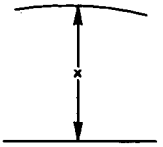 |

FIG - 8E

| ATTITUDE | | | |
|---|---|---|---|
| Code | Description | MM | IN |
| H101 | Vehicle Height (curb Load) | 1908.1 | 75.1 |
| H103 | Front Bumper to Ground (curb wt.) | 260.8 | 10.3 |
| H105 | Rear Bumper to Ground (curb wt.) | 535.4 | 21.1 |
| H106 | Angle of Approach | 18.8 deg | 18.8 deg |
| H107 | Angle of Departure | 27.0 deg | 27.0 deg |
| H130 | Step Height-Front (curb weight) | 549.8 | 21.6 |
| H131 | Step Height-Second (curb weight) | 552.4 | 21.7 |
| H147 | Ramp Breakover Angle | 22.9 deg | 22.9 deg |
| H148 | Suspension or Axle to Ground - Front | 228.4 | 9.0 |
| H153 | Suspension or Axle to Ground - Rear | 220.8 | 8.7 |
| H156 | Minimum Running Ground Clearance | 220.8 | 8.7 |
| H195 | Liftover Height | 1970.9 | 54.0 |
| H250 | Open Tailgate to Ground | 884.8 | 34.0 |
| H431 | Vehicle Height - curb weight, roof rack | 1908.1 | 75.1 |
| H501 | Cargo Floor height to ground | 836.0 | 32.9 |

FIG - 10A

| EXTERIOR LENGTH | | | |
|---|---|---|---|
| Code | Description | MM | IN |
| L101 | Wheelbase | 4078.6 | 160.5 |
| L103 | Vehicle Length | 6292.2 | 247.7 |
| L104 | Overhang - Front | 999.7 | 39.4 |
| L105 | Overhang - Rear | 1215.9 | 47.9 |
| L125 | Cowl Point - X coordinate | 1709.2 | 67.3 |
| L127 | Rear Wheel Centerline X coordinate | 8468.6 | 215.3 |
| L128 | Front Wheel Centerline X coordinate | 1392.0 | 54.8 |
| L403 | Front of Bumper to Back of Cab | 3631.0 | 143.0 |
| L404 | Cao to Rear Axle | 1445.3 | 56.9 |
| L410 | Cao Length | 2314.1 | 91.1 |
| L504 | Cao to Pickup Body | 17.5 | 0.7 |
| L505 | Pickup Body Length at Floor | 2496.5 | 98.3 |
| L506 | Pickup Body Length at Top of Body | 2445.8 | 96.3 |
| L507 | Pickup Body Overall Length | 2606.9 | 102.6 |

FIG - 10B

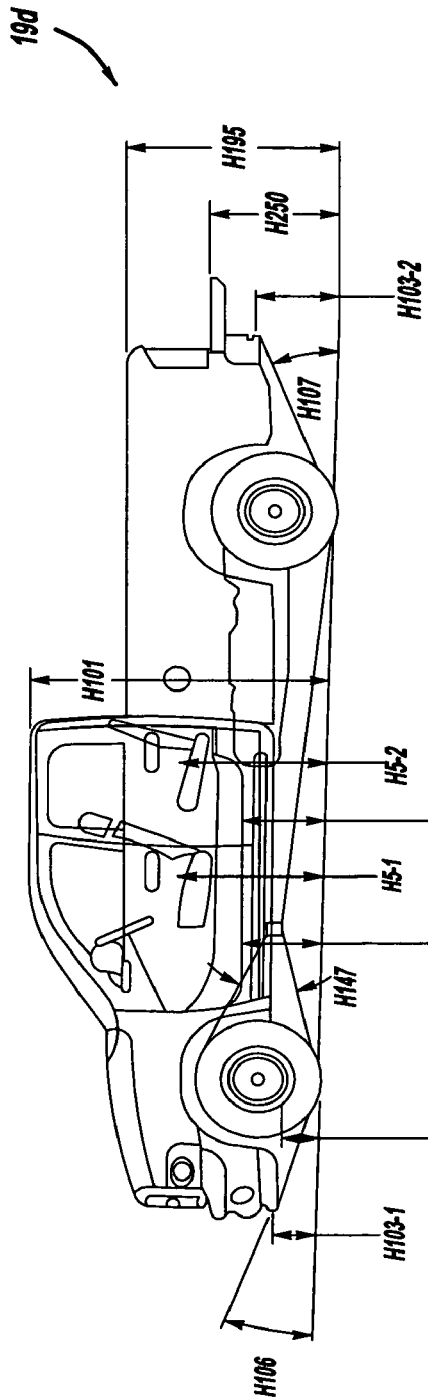

FIG-11

| Code | Description | 265-70R17 | | 245-70R17 | | 275-55R22G | |
|---|---|---|---|---|---|---|---|
| | | mm | in | mm | in | mm | in |
| H106 | Angle of Approach | 18.8 | 18.8 | 16.1 | 16.1 | 19.2 | 19.2 |
| H107 | Angle of Departure | 27.0 | 27.0 | 24.9 | 24.9 | 27.2 | 27.2 |
| H147 | Ramp Breakover Angle | 22.8 | 22.8 | 19.8 | 19.8 | 23.2 | 23.2 |
| H5-1 | SgRP - Front to Ground | 915.6 | 36.0 | 900.3 | 35.0 | 933.4 | 36.7 |
| H5-2 | SgRP - Second to Ground | 944.1 | 37.2 | 928.8 | 36.6 | 961.9 | 37.9 |
| H101 | Vehicle Height (curb Load) | 1908.0 | 75.1 | 1892.8 | 74.5 | 1925.8 | 75.8 |
| H103-1 | Front Bumper to Ground (curb wt.) | 260.8 | 10.3 | 245.5 | 9.7 | 278.5 | 11.0 |
| H103-2 | Rear Bumper to Ground (curb wt.) | 535.2 | 21.1 | 520.0 | 20.5 | 553.0 | 21.9 |
| H130 | Step Height - Front (curb weight) | 533.5 | 21.0 | 518.3 | 20.4 | 551.3 | 21.7 |
| H131 | Step Height - Second (curb weight) | 550.8 | 21.7 | 535.6 | 21.1 | 569.6 | 22.4 |
| H148-1 | Suspension or Axel to Ground - Front | 228.4 | 9.0 | 213.2 | 8.4 | 246.2 | 9.7 |
| H195 | Liftover Height | 1370.9 | 54.0 | 1355.6 | 53.4 | 1388.7 | 54.7 |
| H250 | Open Tailgate to Ground | 865.2 | 34.1 | 849.9 | 33.5 | 882.9 | 34.0 |

AUTOMATED DIMENSIONAL DRAWING GENERATING APPARATUS

FIELD

The present invention relates to drawing generation and, more particularly, relates to an automated dimensional drawing generating apparatus.

BACKGROUND

Dimensional drawings are often generated for communicating information about an object. The dimensional drawings show the dimensions of an object to communicate the size of certain features and to communicate the spatial relationship between certain features. Dimensional drawings are also used in sales and marketing materials to convey size information to the consumer.

Vehicle dimensional drawings for instance, are often generated to convey the wheelbase, bumper-to-bumper, ground clearance, and other dimensions of the vehicle. Currently, most vehicles are identified according a predetermined set of dimensions set forth in the Society of Automotive Engineers J1100 dimensioning standards such that each vehicle is dimensioned in the same manner. In addition to the SAE J1100 standard dimensions, vehicle manufacturers typically have a proprietary set of standard dimensions that are identified for each vehicle design. As such, a very large number of dimensions are obtained for each vehicle design.

However, the dimensions are largely obtained manually from preexisting models. This means that drawing views are generated, the dimensions are found and recorded, and then a dimensional drawing is generated. This process can be very tedious and prone to errors. Furthermore, if the design changes, the object may need to be dimensioned again, taking more time and possibly introducing new errors. Also, generating a report of the dimensions can be tedious and prone to errors. Accordingly, there remains a need in the art for a more efficient and accurate means of dimensioning an object and reporting the dimensions of the object.

SUMMARY

A dimensioning apparatus for generating a dimensional drawing from a model of an object, according to a first aspect of the present invention is provided, including an element database with a plurality of predetermined element names. A plurality of model elements can be associated with corresponding element names. The apparatus also includes a model sectioning tool operable to section the model to thereby generate at least a portion of the model elements. The apparatus further includes a dimensioning tool with a plurality of predetermined dimension names and a plurality of dimensioning algorithms associated with corresponding dimension names. At least two of the model elements are utilized by each of the dimensioning algorithms to thereby automatically detect dimension values of the model. The dimensioning tool is further operable to associate the detected dimension values with corresponding ones of the dimension names. In addition, the dimensioning apparatus includes a plotting tool operable to output the dimensional drawing showing the dimension values of the model detected by the dimensioning tool.

Further areas of applicability of the present disclosure will become apparent from the detailed description provided hereinafter. It should be understood that the detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 3 is a list of a plurality of section planes for the automatic dimensioning apparatus according to an exemplary embodiment of the present invention;

FIG. 4 is a list of element names and one example of a naming convention for the element names according to an exemplary embodiment of the present invention;

FIG. 7 is a list of various dimension names included in the automatic dimensioning apparatus according to an exemplary embodiment of the present invention;

FIGS. 8A-8E are charts describing a plurality of dimensioning algorithms for the automatic dimensioning apparatus according to an exemplary embodiment of the present invention;

FIGS. 10A and 10B are embodiments of other dimensional drawings outputted by the automatic dimensioning apparatus according to an exemplary embodiment of the present invention; and FIG. 11 is another embodiment of a dimensional drawing for a vehicle listing of dimension values for three configurations of the vehicle according to an exemplary embodiment of the present invention.

DETAILED DESCRIPTION

The following description of the preferred embodiment(s) is merely exemplary in nature and is in no way intended to limit the disclosure, its application, or uses.

Figure 1:
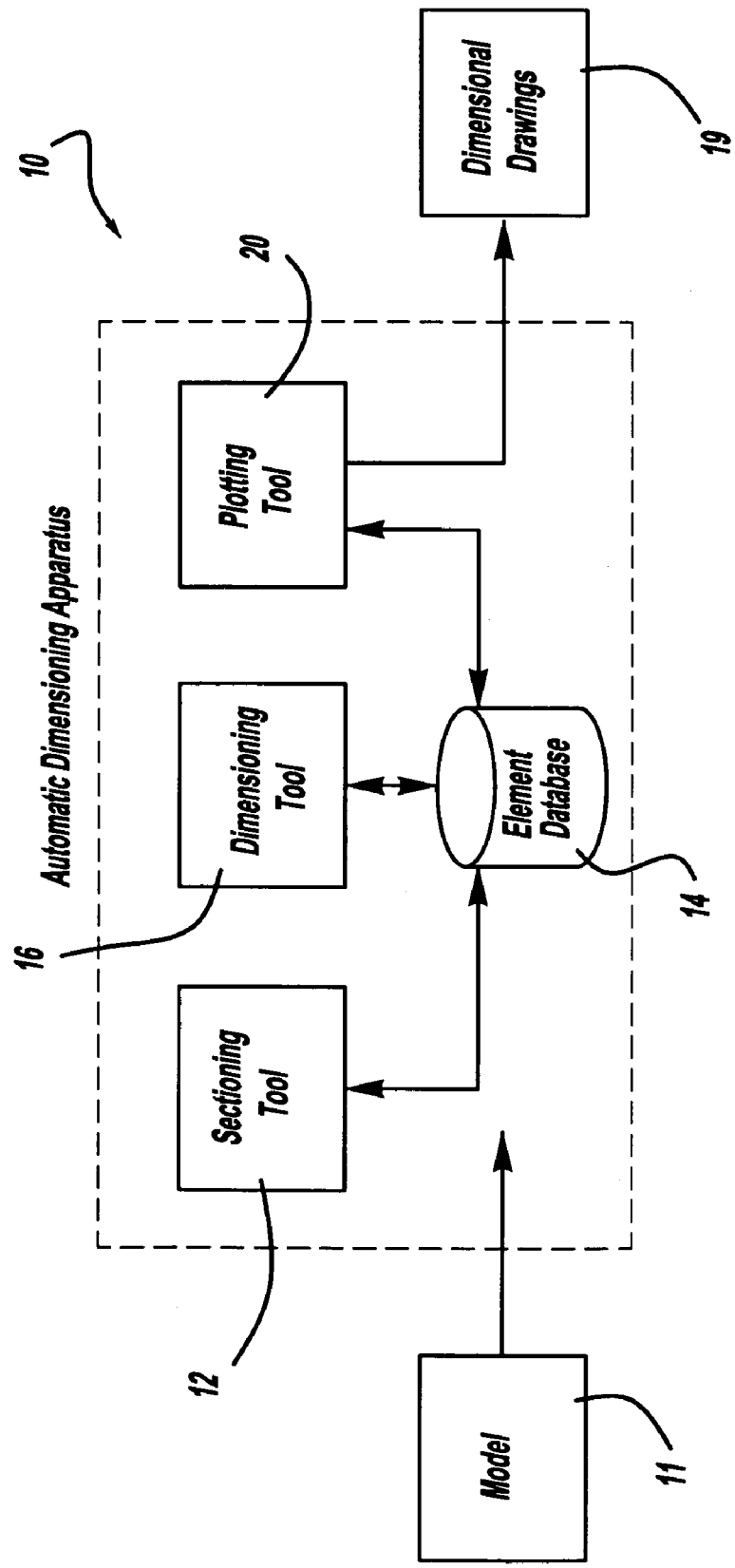
FIG. 1 is a schematic illustration of the automatic dimensioning apparatus according to an exemplary embodiment of the present invention.

Referring initially to FIG. 1, an automatic dimensioning apparatus 10 is schematically illustrated. As shown, a model 11 of an object is inputted into the automatic dimensioning apparatus 10, and the automatic dimensioning apparatus 10 detects and outputs the dimensions of the model 11 by generating dimensional drawings of the model 11, such as the dimensional drawings 19a, 19b, 19c, 19d shown in FIGS. 9, 10A, 10B, and 11, respectively.

Figure 2:
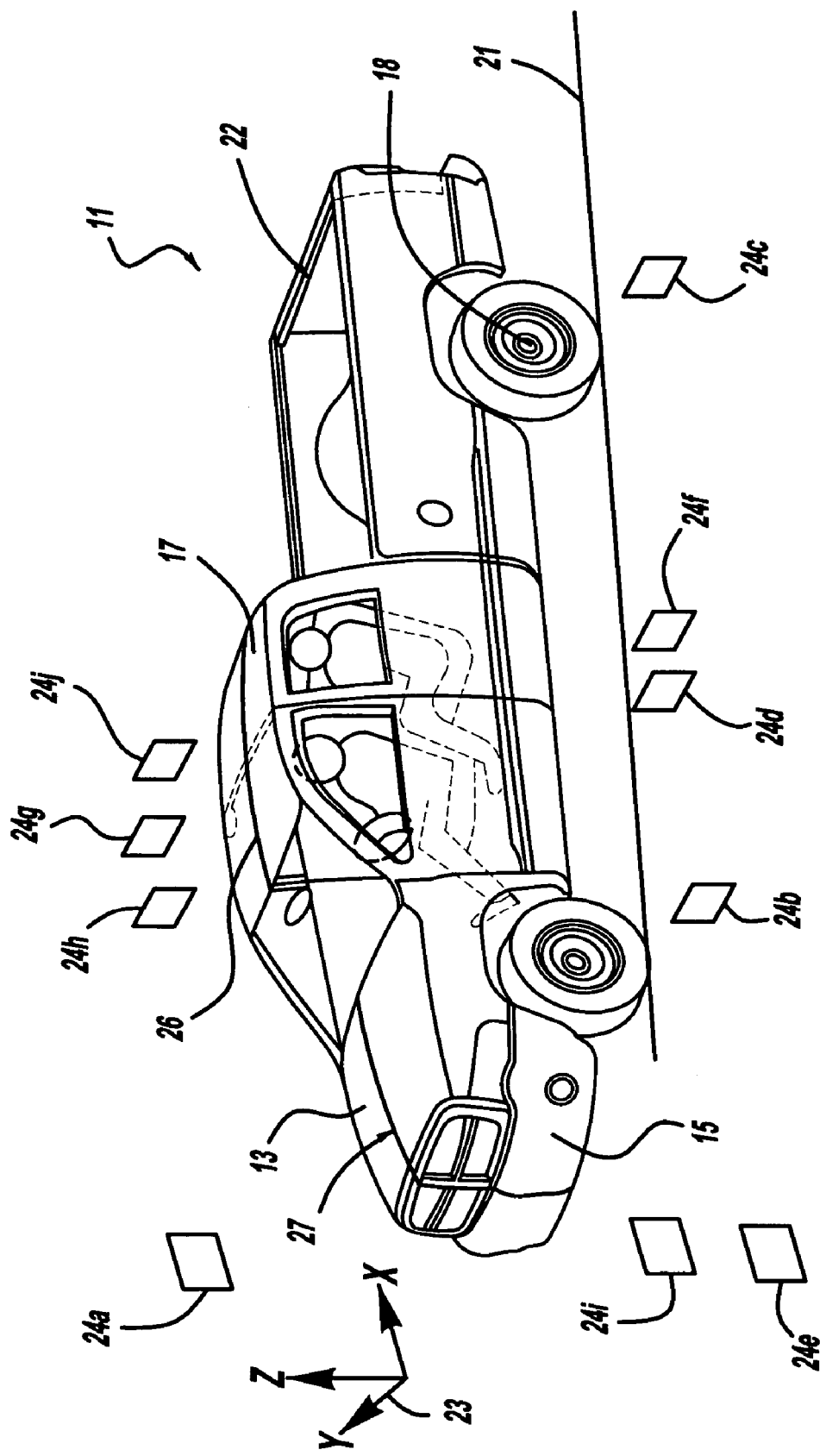
FIG. 2 is an isometric view of a vehicle model and a plurality of section planes used to generate model elements within the vehicle model according to an exemplary embodiment of the present invention.

As shown, the automatic dimensioning apparatus 10 includes a sectioning tool 12, an element database 14, a dimensioning tool 16, and a plotting tool 20. The model 11 includes a plurality of model elements 18. In FIG. 2, the number 18 indicates just one model element, namely, the centerpoint of the driver's side rear tire. However, as will be discussed, the model 11 includes a plurality of model elements 18, such as points, lines, and planes. The coordinates of the model elements 18 are stored and organized within the element database 14. The sectioning tool 12 sections the model 11 to thereby generate additional model elements 18 as will be described. Furthermore, the dimensioning tool 16 utilizes the coordinates of the model elements 18 to thereby automatically detect the dimensions of the model 11, and the dimensions are stored and organized therein. The plotting tool 20 outputs the dimensional drawings, such as the dimensional drawings 19a-19d shown in FIGS. 9, 10A, 10B, and 11, to show the dimension values of the model 11 detected by the dimensioning tool 16. Accordingly, the automatic dimensioning apparatus 10 allows a user to automatically detect the dimensions of the model 11. The automatic dimensioning apparatus 10 also automatically organizes and outputs the dimensions of the model 11. Thus, the automatic dimensioning apparatus 10 provides significant time savings and the dimension values detected using the apparatus 10 are less likely to be erroneous.

The automatic dimensioning apparatus 10 is largely software-based. In one embodiment, the automatic dimensioning apparatus 10 is packaged with computer aided design (CAD) software. As such, the model 11 is generated with the CAD software, and then the model 11 is dimensioned using the automatic dimensioning apparatus 10.

In the embodiment shown in FIG. 2 the model 11 inputted into the automatic dimensioning apparatus 10 is a three-dimensional model 11 of a vehicle 22. However, it will be appreciated that the model 11 could be of any suitable object without departing from the scope of the present disclosure. Also, in one embodiment, the model 11 of the vehicle 22 is a collection of individual components, such as a hood 13, a bumper 15, a roof 17, and the like. The model 11 also includes a ground plane 21. When collected in the model 11, the components represent a vehicle 22 with a high degree of detail; however, it will be appreciated that the model 11 could include any number of components with any suitable amount of detail.

Furthermore, each of the components of the model 11 is located relative to a coordinate system 23. In FIG. 2, for instance, the coordinate system 23 is oriented such that the X-axis is directed lengthwise relative to the vehicle 22, the Z-axis is directed vertically relative to the vehicle 22, and the Y-axis is directed widthwise relative to the vehicle 22. The Y-plane (i.e., the plane normal to the Y-axis) where Y is equal to zero extends through the centerline of the vehicle 22 such that the model 11 is substantially symmetric relative to the Y-plane where Y is equal to zero. If different models 11 are dimensioned with the dimensioning apparatus 10, each model 11 can be located in the same manner relative to the coordinate system 23. In other words, all truck models, all car models, and all other vehicle models can each be located in the same manner relative to the coordinate system 23 for uniformity.

The element database 14 includes a plurality of predetermined element names 25. FIG. 4 represents one embodiment of a menu that a user could view to see the element names 25. The model elements 18 can be associated with corresponding element names 25. For instance, the element database 14 includes the element name "ERGO_VehWheelRearSpindlePt". This element name 25 refers to a particular model element 18, namely the centerpoint of the driver's side rear wheel. To associate the two, the user selects the centerpoint of the rear wheel and also selects the element name "ERGO_VehWheelRearSpindlePt". Once associated, the coordinates of the wheel centerpoint are thereafter stored under the name "ERGO_VehWheelRearSpindlePt" within the element database 14.

It will be appreciated that the user can select model elements 18 in any suitable manner, such as by clicking on the model element using a computer mouse, by typing in coordinates, and the like. It will also be appreciated that the model elements 18 could be of any suitable type, such as points, straight lines, curved lines, planes, and the like.

The model elements 18 serve as reference coordinates for detecting the dimensions of the model 11 as will be discussed. For instance, using the example of the centerpoint of the rear wheel, the coordinates of this model element 18 may be used (in combination with the centerpoint of the front wheel) to obtain the wheelbase dimension value of the vehicle 22 as will be discussed.

It will be appreciated that the element database 14 is a convenient means for storing and organizing the coordinates of model elements 18. First, the element names 25 are already typed into the element database 14. This makes associating the model elements 18 with corresponding element names 25 easier and more accurate, since the user does not need to type in the name manually or decide on new naming conventions every time the dimensioning apparatus 10 is used. Furthermore, as shown in FIG. 4, the element names 25 include several predetermined fields for quicker identification and organizing of the model elements 18. In the example of FIG. 4, the element names 25 include a domain field, an object field, an object detail field, and an object type field. Using the example element name of "ERGO_VehWheelRearSpindlePt", the "Ergo" portion signifies that the associated model element 18 is of the vehicle 22. The "VehWheel" portion of the name 25 signifies that the associated model element 18 is from the vehicle wheel. The "Rear" portion of the name 25 signifies that the associated model element is from the rear wheel. Also, the "SpindlePt" portion of the name 25 signifies that the associated model element 18 is a centerpoint of the wheel. It will be appreciated that the element names 25 included in the element database 14 could have any suitable naming convention.

In addition, some element names 25 may correspond to a movable component of the vehicle 22. For instance, one element name 25 may refer to the tailgate of the vehicle 22 in the closed position, and another element name 25 may refer to the tailgate in the open position. The user moves the tailgate within the model 11 and associates corresponding model elements 18 for the tailgate in both positions.

Furthermore, the element database 14 indicates whether or not a model element 18 has been associated with its corresponding element name 25. In the embodiment shown in FIG. 4, the element database 14 includes an "X" next to the element names 25 with associated model elements 18. If an "X" does not appear next the element name 25, the user knows that the element name 25 has not been associated with its corresponding model element 18. Accordingly, it is apparent to the user which associations need to be made.

As mentioned above, the automatic dimensioning apparatus 10 also includes a model sectioning tool 12. Using the model sectioning tool 12, the model 11 is sectioned to thereby generate additional model elements 18 and to generate lines that are used in the dimensional drawings, such as the drawings 19a-19d shown in FIGS. 9, 10A, 10B, and 11. More specifically, using the model sectioning tool 12, the model 11 is sectioned along a plurality of predetermined section planes. For instance, FIG. 2 includes a plurality of section planes

24*a*-24*j* that specify the locations at which the model 11 is sectioned. As shown in FIG. 3, the sectioning tool 12 also includes a list of predetermined section names 29*a*-29*m* that correspond with the section planes 24*a*-24*j* shown in FIG. 2. FIG. 3 represents a menu that the user could use to view the section names 29*a*-29*m*. It will be appreciated that the number, location, and orientation of the section planes 24*a*-24*j* could be adapted according to particular dimensioning needs.

In the embodiment shown, the model 11 is sectioned at a vehicle centerline plane 24*a*. The centerline plane 24*a* is a Y-plane (a plane that is normal to the Y-axis) that extends through the vehicle centerline. Other section planes include a front spindle plane 24*b*, which is an X-plane (a plane that is normal to the X-axis) extending through the axis of the front axle of the vehicle 22. The rear spindle plane 24*c* is an X-plane that extends through the axis of the rear axle of the vehicle 22. The first driver plane 24*d* is an X-plane that extends through a reference point (e.g., the H-point) of the driver. The second driver plane 24*e* is a Y-plane that extends through a reference point (e.g., the H-point) of the driver. The driver head plane 24*f* is an X-plane that extends through the center of the driver's head. The first rear occupant plane 24*g* is an X-plane that extends through a reference point (e.g., the H-point) of the rear occupant. The second rear occupant plane 24*h* is an X-plane that extends a predetermined distance (e.g., 330 mm) in front of the rear occupant. The third rear occupant plane 24*i* is a Y-plane that extends through a reference point of the rear occupant. The rear occupant head plane 24*j* is an X-plane that extends through the center of the head of the rear occupant. FIG. 3 also lists planes 24*k*, 24*l*, 24*m* that are applicable for vehicle models 22 having third row occupants.

The user can provide the coordinates for each sectioning plane 24*a*-24*m* in any suitable manner. For instance, the user can select one of the section names 29*a*-29*m* and then type in the proper coordinates for that section name 29*a*-29*m*. The user could also select the section name 29*a*-29*m* and then select model elements 18 located in the desired plane. Once the coordinates for the section planes 24*a*-24*m* are provided, the model sectioning tool 12 is able to section the model 11.

The model 11 is sectioned along the section planes 24*a*-24*m* in order to generate model elements 18 in the form of section lines 27 (FIG. 2). Each section line 27 represents an intersection between the model 11 and one of the section planes 24*a*-24*m*. For example, the model sectioning device 12 sections the model 22 along the vehicle centerline plane 24*a* to generate a roof center section line 26 (FIG. 2). The roof center section line 26 represents the intersection between the roof 17 of the vehicle 22 and the vehicle centerline plane 24*a*.

Once the section lines 27 are generated, the coordinates of the section lines 27 can be associated with corresponding element names 25 listed in the element database 14. For instance, once the roof center section line 26 is generated, it can be associated with the "ERGO_VehExtRoofYSectCrv" element name 25 shown in FIG. 4 in the manner described above. It will be appreciated that each section plane 24*a*-24*m* itself could be a model element 18 for dimensioning purposes and have an associated element name 25 within the element database 14.

As mentioned above in connection with FIG. 1, the dimensioning apparatus 10 also includes a dimensioning tool 16. The dimensioning tool 16 includes a plurality of pre-programmed dimensioning algorithms 30, such as those listed in FIGS. 8A-8E. At least two of the model elements 18 are utilized by each dimensioning algorithm 30 to thereby automatically detect dimension values of the model 11 as will be described.

The dimensioning tool 16 also includes a plurality of predetermined dimension names 32, such as the dimension names 32 listed in FIG. 7. In one embodiment, the dimension names XXX correspond to the dimensions included in the SAE J1100 standards and any other proprietary dimensions used for identifying the vehicle 22. Each dimension name 32 is associated with an appropriate dimensioning algorithm 30 for automatically detecting a corresponding dimension value. The dimensioning tool 16 automatically detects the dimension values of the model 11 and then automatically associates the detected values with corresponding dimension names 32.

For instance, to detect the wheelbase length, the dimensioning tool 16 automatically accesses the element database 14 to find the coordinates for the centerpoint of the front driver side wheel and the coordinates for the centerpoint of the rear driver side wheel. Then, the dimensioning tool 16 uses the "CAIPtToPtXYZDistDim" algorithm 30 (FIG. 8A) to automatically measure the distance along the Y-axis between the two centerpoints and automatically stores this value under the name "Wheelbase" (FIG. 7). As shown in FIGS. 8A-8E, other algorithms 30 can detect tangents of model elements 18, detect the maximum or minimum distance between two vehicle elements 18, and other functions to thereby detect the desired dimension values. It will be appreciated that the dimensioning tool 16 can include any number and type of algorithms 30 to detect the necessary dimension values.

Also, in one embodiment, the dimensioning apparatus 10 automatically indicates to the user if a model element 18 is unavailable (i.e., whether a model element 18 has not been associated with its corresponding element name 25) for generating a particular dimension. For instance, if a user attempts to find a dimension value of the wheelbase, but the coordinates of the wheel centerpoints have not been associated within the element database 14, a message window will pop up that informs the user of this fact.

Figure 5:
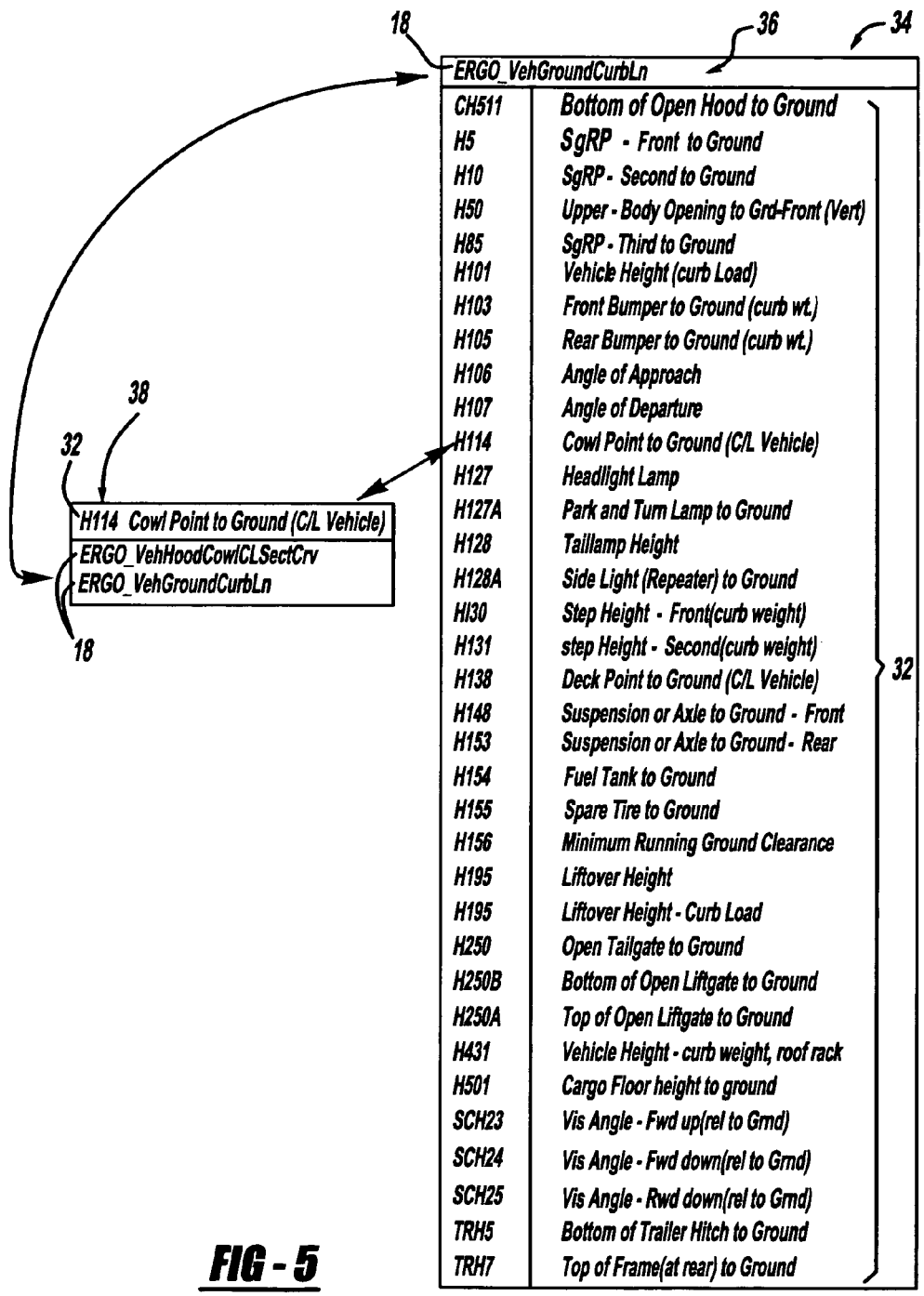
FIG. 5 is one embodiment of a contextual map for the automatic dimensioning apparatus according to an exemplary embodiment of the present invention.

As shown in FIG. 5, the dimension names 32 are associated with corresponding element names 18 to form a contextual map 34. The contextual map 34 is visible to the user as one or more lists such as those shown in FIG. 5. In the embodiment shown, the contextual map 34 displays a first list 36 that shows a model element 18 and each of the dimensions that utilize that model element 18. For instance, as shown in FIG. 5, the model element 18 associated with "ERGO_VehGroundCurbLn" is needed to find the distance from the bottom of the open hood to the ground, the vehicle height, and other dimensions. The contextual map 18 can also be used to display a second list 38 that shows a dimension name 32 and each of the model elements 18 that are needed to find that particular dimension. For instance, as shown in FIG. 5, the contextual map 34 reveals that the model elements "ERGO_VehHoodCowlCLSectCrv" and "ERGO_VehGroundCurbLn" are necessary to find the dimension "Cowl Point to Ground" along the centerline of the vehicle 22. It will be appreciated that the contextual map 34 visually guides the user by revealing which model elements 18 are associated with each dimension name 32 and vice versa.

Figure 9:
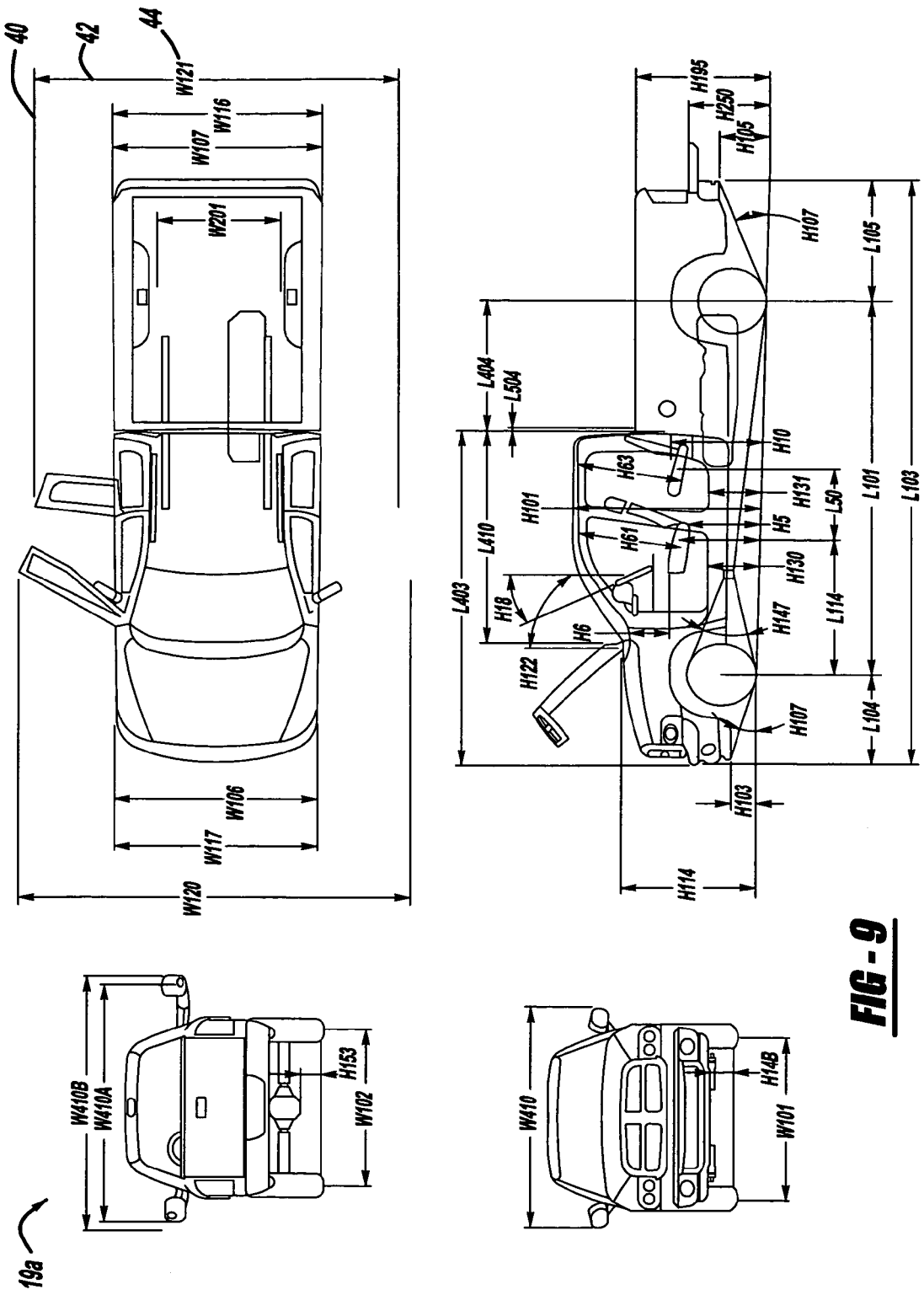
FIG. 9 is one embodiment of a dimensional drawing outputted by the automatic dimensioning apparatus according to an exemplary embodiment of the present invention.

Once the dimensions of the model 11 have been detected, the plotting tool 20 outputs necessary dimensional drawings 19*a*-19*d*, such as those shown in FIGS. 9, 10A, 10B. As shown in FIG. 9, the plotting tool 20 generates several views of the vehicle 22 including top, side, front, and back views.

Figure 6A:
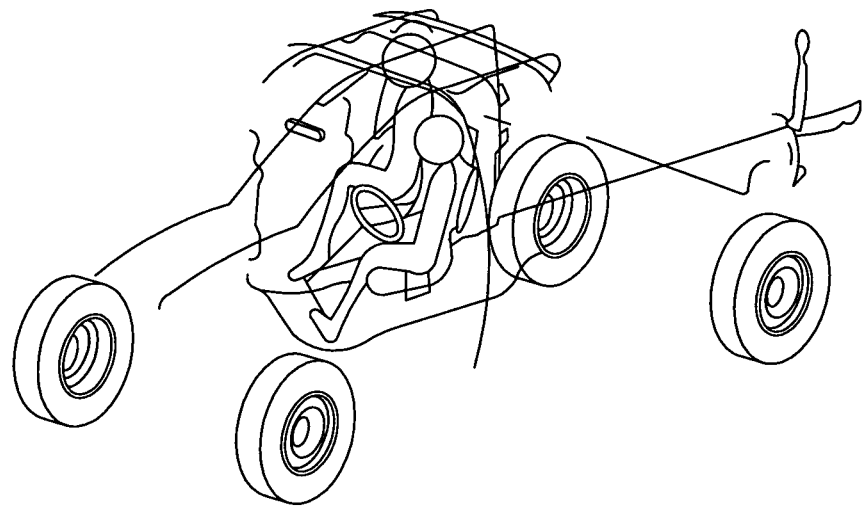
FIG. 6A is an isometric view of a vehicle comprising a plurality of model elements used for generating a dimensional drawing according to an exemplary embodiment of the present invention.
Figure 6B:
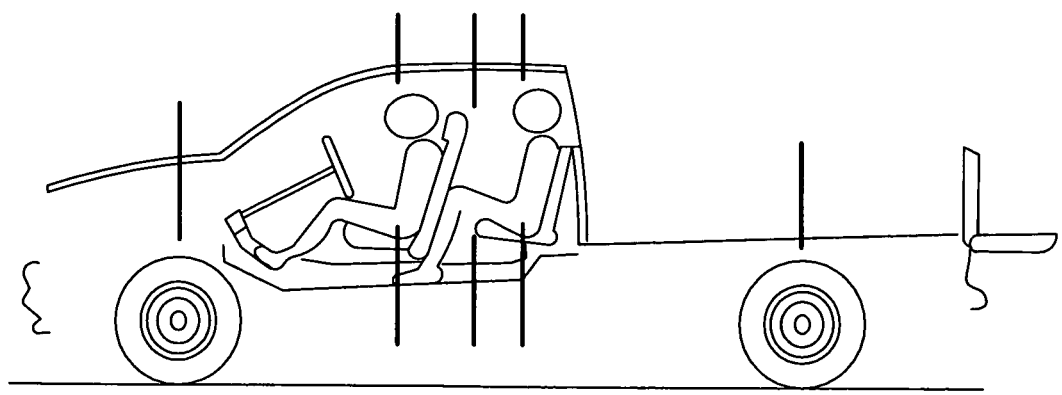
FIG. 6B is a side view of the vehicle taken from FIG. 6A according to an exemplary embodiment of the present invention.

In one embodiment, the section lines 27 generated by the model sectioning tool 12 are automatically included in the views of the vehicle 22. For instance, the plotting tool 20 automatically accesses the element database 14 and obtains the "ERGO_VehExtRoofYSectCrv" as well as other section lines 27 of the vehicle 22 to create the drawing views shown in FIG. 9. For example, FIG. 6A shows several model elements 18, namely section lines 27 as well as tires. As seen in FIG. 6B, the section lines 27 and tires viewed from the side show a partially completed view to be included in the dimensional drawing 19a of FIG. 9.

As shown in FIG. 9, the plotting tool 20 also automatically places dimension lines 40, arrows 42, and dimension codes 44 onto the dimension drawing 19a. The plotting tool 20 also generates dimensional drawings 19b, 19c in the form of charts that include the dimension values (FIGS. 10A, 10B). In the embodiment shown, the dimension codes 44, descriptions of the dimensions 46, metric dimension values 48, and English dimension values 50 are listed in the charts.

In one embodiment, the plotting tool 20 is pre-programmed to generate dimensional drawings 19 that comply with the SAE J1100 dimension standards. The plotting tool 20 can also be customized to generate only certain views and/or to list certain dimensions.

As shown in FIG. 11, the plotting tool 20 is also able to output the dimension values of different configurations of the model 11. In the embodiment shown in FIG. 11, dimension values have been obtained for a first configuration 52 in which the vehicle 22 has 265-70R17 tires, a second configuration 54 in which the vehicle 22 has 245-70R17 tires, and a third configuration 56 in which the vehicle 22 has 275-55R2G tires. The dimension values for each vehicle configuration are detected and separately stored in the manner described above. Then, the plotting tool 20 organizes and lists the detected dimensions for each vehicle configuration as shown in FIG. 11. Accordingly, the automatic dimensioning tool 10 can be used to quickly output dimensional drawings 19 with a variety of configurations.

In sum, the automatic dimensioning apparatus 10 facilitates dimensioning of a model 11. The dimension values of the model 11 can be detected and organized quickly and accurately. Also, the apparatus 10 can output dimensional drawings 19 quickly and accurately. Thus, the automatic dimensioning apparatus 10 provides significant time savings and is less likely to provide erroneous dimension values for the model 11.

The above description is merely exemplary in nature and, thus, variations that do not depart from the gist of the disclosure are intended to be within the scope of the disclosure. Such variations are not to be regarded as a departure from the spirit and scope of the disclosure.

What is claimed is:

1. A computer-readable storage medium storing computer executable instructions which when executed on a computer perform a method for generating dimensional drawings for a model object comprising a plurality of model elements, the medium comprising instructions for:

storing in an element database a plurality of predetermined model elements of the model object and corresponding element names that are standardized for a plurality of computerized models of the model object;

selecting using a user interface a plurality of model elements of one of the computerized models, and associating, using the user interface, at least some of the model elements with corresponding element names;

sectioning the one of the computerized models using a model sectioning tool to generate at least a portion of the model elements;

defining in a dimensioning tool a plurality of predetermined dimension names that are standardized for each of the computerized models and a plurality of dimensioning algorithms associated with corresponding ones of the dimension names;

automatically computing, using the dimensioning tool, dimension values of at least one of the model elements of the one of the computerized models using the dimensioning algorithms and the coordinates and dimensions of at least some of the model elements;

automatically associating, using the dimensioning tool, the computed dimension values with corresponding ones of the dimension names; and outputting, using a plotting tool, a dimensional drawing showing the dimension values of at least of the model elements of the one of the computerized models detected by the dimensioning tool.

2. The medium of claim 1, wherein the model elements generated by the model sectioning tool are section lines that are included in the dimensional drawing outputted by the plotting tool.

3. The medium of claim 1, further comprising a contextual map that shows at least one element name and the dimension names that utilize the model element associated with the at least one element name.

4. The medium of claim 1, wherein the element database indicates whether or not a model element is associated with the corresponding one of the element names.

5. The medium of claim 1, wherein the plotting tool outputs the dimensional drawing such that the dimensional drawing shows the dimension values of at least one of the model elements of the one of the computerized models having a plurality of configurations.

6. The medium of claim 1, wherein the plotting tool outputs a plurality of predetermined views of the one of the computerized models and the dimension values detected by the dimensioning tool.

7. The medium of claim 1, wherein the dimensioning tool automatically indicates when a model element has not been associated with the corresponding element name needed for generating a particular dimension value.

8. The medium of claim 1, wherein the model object comprises a model vehicle comprising a plurality of vehicle model elements.

9. A computer implemented method for generating dimensional drawing for a model object comprising a plurality of model elements, the method comprising:

storing in an element database a plurality of predetermined model elements of the model object and corresponding element names that are standardized for a plurality of computerized models of model object;

selecting using a user interface a plurality of model elements of one of the computerized models, and associating, using the user interface, at least some of the model elements with corresponding element names;

sectioning the one of the computerized models using a model sectioning tool to generate at least a portion of the model elements;

defining in a dimensioning tool a plurality of predetermined dimension names that are standardized for each of the computerized models and plurality of dimensioning algorithms associated with corresponding ones of the dimension names;

automatically computing, using the dimensioning tool, dimension values at least one of the model elements of the one of the computerized models using the dimensioning algorithms and the coordinates and dimensions of at least some of the model elements;

automatically associating, using the dimensioning tool, the computed dimension values with corresponding ones of the dimension names; and outputting, using a plotting tool, a dimensional drawing showing the dimension values of at least one of the model elements of the one of the computerized models detected by the dimensioning tool.

10. The method of claim 9, wherein the model elements generated by the model sectioning tool are section lines that are included in the dimensional drawing outputted by the plotting tool.

11. The method of claim 9, further comprising a contextual map that shows at least one element name and the dimension names that utilize the model element associated with the at least one element name.

12. The method of claim 9, wherein the element database indicates whether or not a model element is associated with the corresponding one of the element names.

13. The method of claim 9, wherein the plotting tool outputs the dimensional drawing such that the dimensional drawing shows the dimension values of at least one of the model elements of the one of the computerized models having a plurality of configurations.

14. The method of claim 9, wherein the plotting tool outputs a plurality of predetermined views of the one of the computerized models and the dimension values detected by the dimensioning tool.

15. The method of claim 9, wherein the dimensioning too automatically indicates when a model element has not been associated with the corresponding element name needed for generating a particular dimension value.

16. The method of claim 9, wherein the model object comprises a model vehicle comprising a plurality of vehicle model elements.

* * * * *